(12) United States Patent
Jang et al.

(10) Patent No.: US 6,255,206 B1
(45) Date of Patent: Jul. 3, 2001

(54) METHOD OF FORMING GATE ELECTRODE WITH TITANIUM POLYCIDE STRUCTURE

(75) Inventors: Se Aug Jang; Tae Kyun Kim; In Seok Yeo, all of Kyoungki-do; Sahng Kyoo Lee, Seoul, all of (KR)

(73) Assignee: Hyundai Electronics Industries Co., Ltd., Ich'ǒn (KR)

( * ) Notice: Subject to any disclaimer, the term of this patent is extended or adjusted under 35 U.S.C. 154(b) by 0 days.

(21) Appl. No.: 09/434,647

(22) Filed: Nov. 5, 1999

(30) Foreign Application Priority Data

Nov. 26, 1998 (KR) .................................................. 98-51104

(51) Int. Cl.$^7$ ................... H01L 21/3205; H01L 21/4763
(52) U.S. Cl. .......................... 438/595; 438/592; 438/769; 438/770
(58) Field of Search ................................... 438/591, 592, 438/595, 768–770

(56) References Cited

U.S. PATENT DOCUMENTS

| | | | |
|---|---|---|---|
| 5,012,320 | 4/1991 | Yamazaki | 257/755 |
| 5,023,682 | 6/1991 | Shimizu et al. | 257/297 |
| 5,130,266 | 7/1992 | Huang et al. | 438/231 |
| 5,268,321 | 12/1993 | Shimizu et al. | 438/252 |
| 5,320,975 * | 6/1994 | Cederbaum et al. | 438/153 |
| 5,648,287 | 7/1997 | Tsai et al. | 438/305 |
| 5,672,544 | 9/1997 | Pan | 438/305 |
| 5,741,725 | 4/1998 | Inoue et al. | 438/664 |
| 5,874,353 | 2/1999 | Lin et al. | 438/592 |
| 5,880,500 | 3/1999 | Iwata et al. | 257/336 |
| 5,994,192 * | 11/1999 | Chen | 438/303 |
| 6,001,718 * | 12/1999 | Katata et al. | 438/592 |

FOREIGN PATENT DOCUMENTS

| | | |
|---|---|---|
| 0115287 | 1/1984 | (EP) . |
| 0466166 | 7/1991 | (EP) . |
| 2077993 | 12/1981 | (GB) . |
| 08250723 | 9/1996 | (JP) . |
| 09162409 | 6/1997 | (JP) . |
| 09199614 | 7/1997 | (JP) . |
| 09293864 | 11/1997 | (JP) . |
| 1-0135459 | 5/1998 | (JP) . |

* cited by examiner

*Primary Examiner*—Stephen D. Meier
*Assistant Examiner*—Jamie L. Brophy
(74) *Attorney, Agent, or Firm*—Finnegan, Henderson, Farabow, Garrett & Dunner, L.L.P.

(57) ABSTRACT

A method of forming a gate electrode with a titanium polycide structure which can prevent abnormal oxidation of the gate electrode and reduce the resistivity of the gate electrode when performing a re-oxidation process, is disclosed.

According to the present invention, a gate oxide layer, a polysilicon layer and a titanium silicide layer are formed on a semiconductor substrate, in sequence. A mask insulating layer is then formed in the shape of a gate electrode on the titanium silicide layer and the titanium silicide layer and the polysilicon layer are etched using the mask insulating layer to form a gate electrode. Thereafter, the substrate is oxidized using re-oxidation process to form an oxide layer with a uniform thickness on the side wall of the gate electrode and on the surface of the substrate. Here, the re-oxidation process is performed at the temperature of 750° C. or less using dry oxidation. Furthermore, the re-oxidation process is performed at the temperature of 700 to 750° C. and the oxide layer is formed to the thickness of 30 to 60 Å, preferably, about 50 Å.

7 Claims, 5 Drawing Sheets

METHOD OF FORMING GATE ELECTRODE WITH TITANIUM POLYCIDE STRUCTURE

BACKGROUND OF THE INVENTION

1. Field of the Invention

The present invention relates to a method of manufacturing a semiconductor device, and more particularly to a method of forming a gate electrode with a titanium polycide structure in which a titanium silicide layer is formed on a polysilicon layer.

2. Description of the Related Art

In general, a gate electrode of a MOS transistor has been formed of a doped polysilicon layer. However, as semiconductor device is highly integrated, the line widths of a gate electrode and other patterns become fine. Recently, the line width is reduced below 0.15 μm. Therefore, there are problems that it is difficult to apply the doped polysilicon layer to a gate electrode material in a high speed device, since the doped polysilicon layer has a high resistivity. These problems are also growing more and more serious as the high integration of the semiconductor. To overcome these problems, a gate electrode with a titanium polycide structure in which a titanium silicide layer is formed on the polysilicon layer, is mainly applied to a semiconductor device over 1GDRAM.

FIG. 1A to FIG. 1E are cross sectional views describing a method of forming a gate electrode with a titanium polycide structure according to a prior art.

Referring to FIG. 1A, a gate insulating layer 12 is formed on a semiconductor substrate 11 by thermal growth or deposition method and a doped polysilicon layer 13 is formed thereon. Next, a titanium silicide(TiSi$_x$) layer 14 of an amorphous phase is deposited on the polysilicon layer 13 by physical vapor deposition(PVD) using TiSi$_x$ target, as shown in FIG. 1B. Rapid thermal processing(RTP) is then performed at a selected temperature for several seconds, to transform the TiSi$_x$ layer 14 of the amorphous phase into a TiSi$_2$ layer 14a of a crystalline phase, as shown in FIG. 1C.

Referring to FIG. 1D, a mask insulating layer 15 is formed in the shape of a gate electrode on the TiSi$_2$ layer 14a, for a conventional self-aligned contact(SAC) process which will be performed after. Here, the mask insulating layer 15 is formed of an oxide layer or a nitride layer. Thereafter, the TiSi$_2$ layer 14a and the polysilicon layer 13 are etched using the mask insulating layer 15 as an etch mask, to form a gate electrode 100.

Referring to FIG. 1E, for removing damage due to the etching process and recovering the reliability of the gate insulating layer 12, the structure of FIG. 1D is oxidized by re-oxidation process to form an oxide layer 16 on the side wall of the gate electrode 100 and on the surface of the substrate 11. The re-oxidation process is generally performed at the temperature 800° C. or more.

However, when performing the re-oxidation process, the side wall of the TiSi$_2$ layer 14a of the gate electrode 100 is excessively oxidized due to the fast oxidation rate of the TiSi$_2$ layer 14a, thereby reducing the line width of the TiSi$_2$ layer 14a and aggravating the morphology of the gate electrode 100, as shown in FIG. 1E. Therefore, it is difficult to perform ion-implantation for forming a source and a drain subsequently. Furthermore, the resistivity of the gate electrode increases, thereby deteriorating the reliability of a device.

SUMMARY OF THE INVENTION

It is therefore an object of the present invention to a method of forming a gate electrode with a titanium polycide structure which can prevent abnormal oxidation of the gate electrode and reduce the resistivity of the gate electrode when performing a re-oxidation process, for solving the problems in the conventional art.

To accomplish this above object, according to the present invention, a gate insulating layer, a polysilicon layer and a titanium silicide layer are formed on a semiconductor substrate, in sequence. A mask insulating layer is then formed in the shape of a gate electrode on the titanium silicide layer. Next, the titanium silicide layer and the polysilicon layer are etched using the mask as an etch mask insulating layer to form a gate electrode. Thereafter, the substrate is oxidized using reoxidation process to form an oxide layer with a uniform thickness on the side wall of the gate electrode and on the surface of the substrate. Here, the re-oxidation process is performed at the temperature of 750° C. or less using dry oxidation.

Furthermore, the re-oxidation process is performed at the temperature of 700 to 750° C. and the oxide layer is formed to the thickness of 30 to 60 Å, preferably, about 50 Å.

Additional object, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, preferred embodiment of the present invention will be explained with reference to accompanying drawings.

FIG. 2A to FIG. 2E are cross sectional views describing a method of forming a gate electrode with a titanium polycide structure according to an embodiment of the present invention.

Figure 2A:
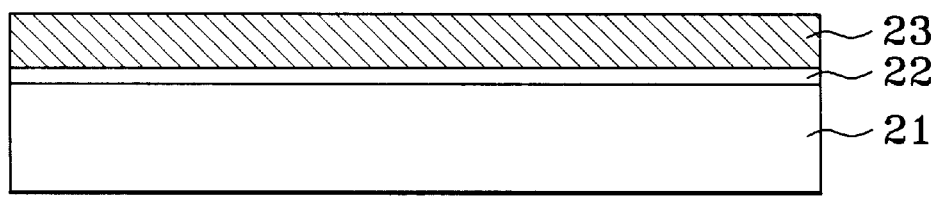
FIG. 2A to FIG. 2E are cross sectional views describing a method of forming a gate electrode with a titanium polycide structure according to the present invention.
Figure 2B:
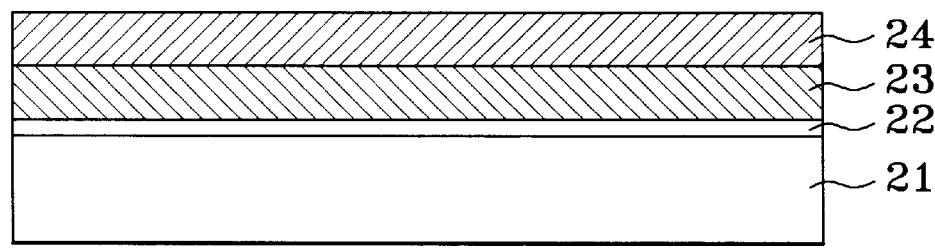
Figure 2C:
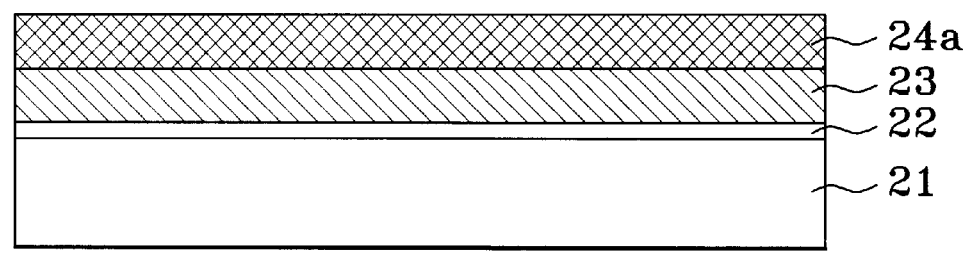

Referring to FIG. 2A, a gate insulating layer 22 is formed on a semiconductor substrate by thermal growth and deposition method and a doped polysilicon layer 23 is formed thereon. As shown in FIG. 2B, a titanium silicide(TiSi$_x$) layer 24 of an amorphous phase is deposited on the polysilicon layer 23 by PVD using TiSi. target. Thereafter, RTP is performed at a selected temperature for several seconds, to transform the TiSi$_x$ layer 24 of the amorphous phase into a TiSi$_2$ layer 24a of a crystalline phase, as shown in FIG. 2C.

Figure 2D:
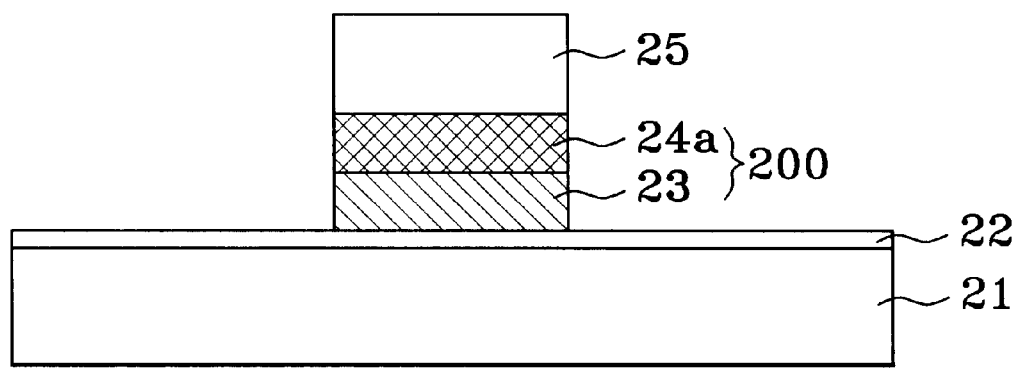

Referring to FIG. 2D, a mask insulating layer 25 is formed in the shape of a gate electrode on the TiSi$_2$ layer 24a, for a conventional self-aligned contact(SAC) process which will be performed after. The mask insulating layer 25 is formed of an oxide layer or a nitride layer. Thereafter, the TiSi$_2$ layer 24a and the polysilicon layer 23 are etched using the mask insulating layer 25 as an etch mask, to form a gate electrode 200.

Figure 2E:
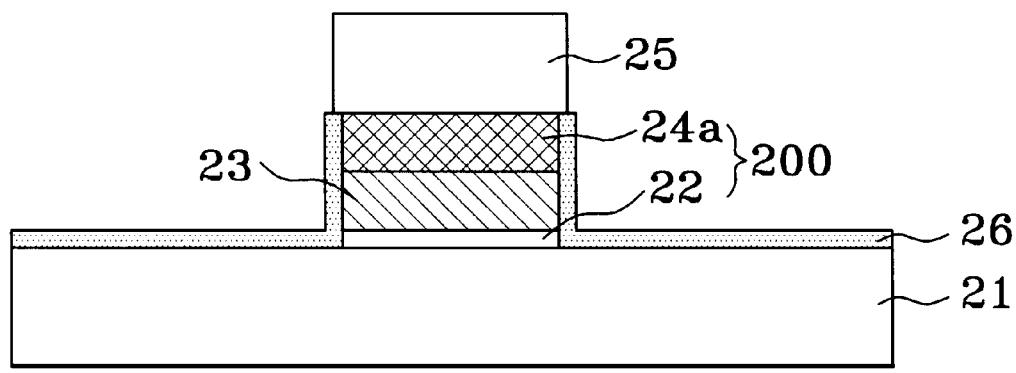

Referring to FIG. 2E, for removing damage due to the etching process and recovering the reliability of the gate insulating layer 22, the structure of FIG. 2D is oxidized by re-oxidation process to form an oxide layer 26 on the side wall of the gate electrode 200 and on the surface of the substrate 21. At this time, the re-oxidation process is performed in the range of the temperature in which the oxidation rate of the $TiSi_2$ layer 24a is equalized to that of the polysilicon layer 22, for forming the oxide layer 26 with an uniform thickness.

Figure 1A:
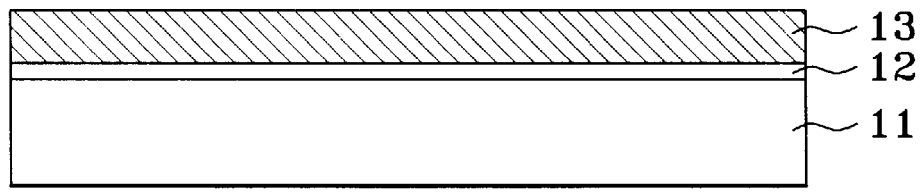
FIG. 1A to FIG. 1E are cross sectional views describing a method of forming a gate electrode with a titanium polycide structure according to the prior art.
Figure 1B:
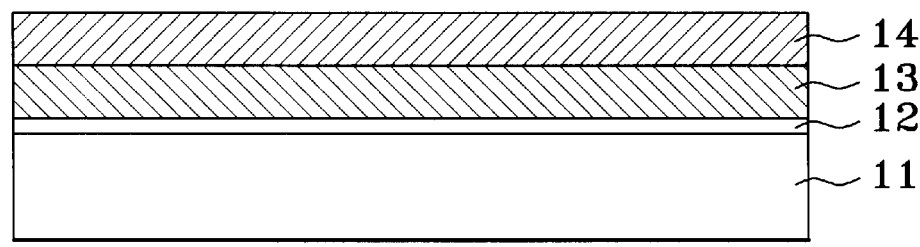
Figure 1C:
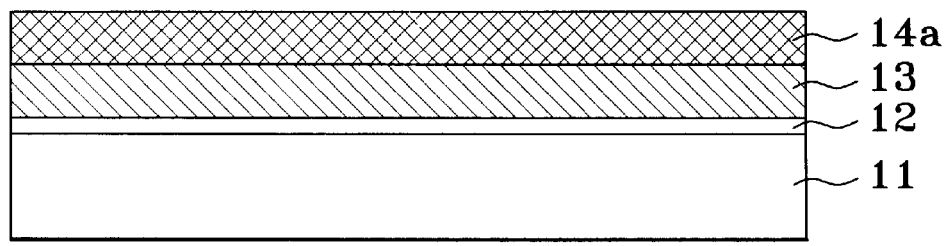
Figure 1D:
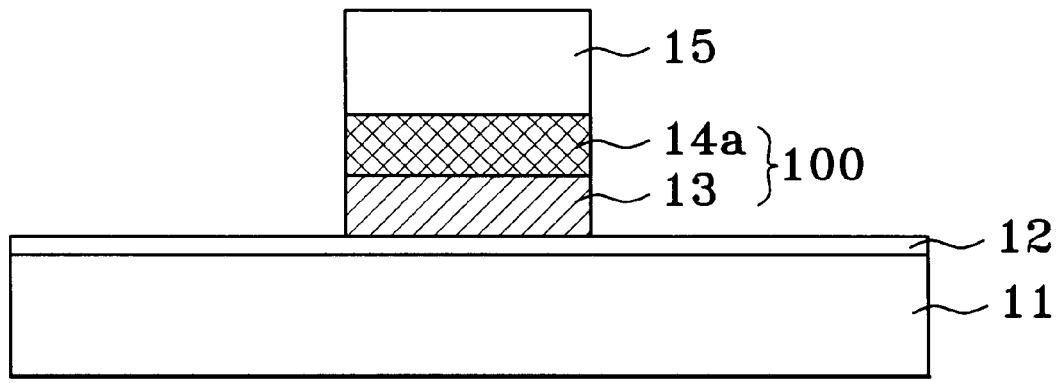
Figure 1E:
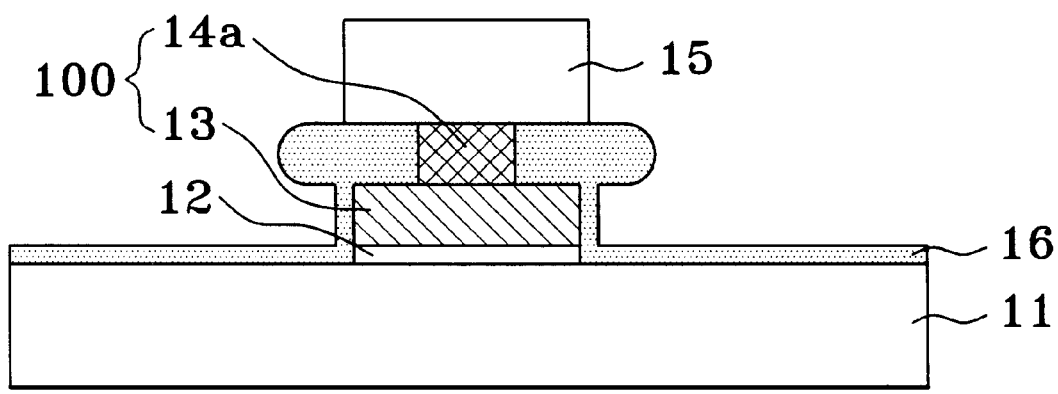

For example, according to an experiment performing the re-oxidation process at 700° C., 750° C., 800° C. and 850° C. respectively, at the temperature of 800° C. and 850° C., $TiSi_2$ layer 24a is higher in the oxidation rate than the polysilicon layer 23, so that the side wall of the $TiSi_2$ layer 24a is excessively oxidized as the prior art(refer to FIG. 1E). On the other hand, at the temperature of 700° C. and 750° C., the oxidation rate of the $TiSi_2$ layer 24a is equalized to that of the polysilicon layer 22, so that the oxide layer 26 is uniformly on the side wall of the gate electrode 200, as shown in FIG. 2E.

Figure 3:
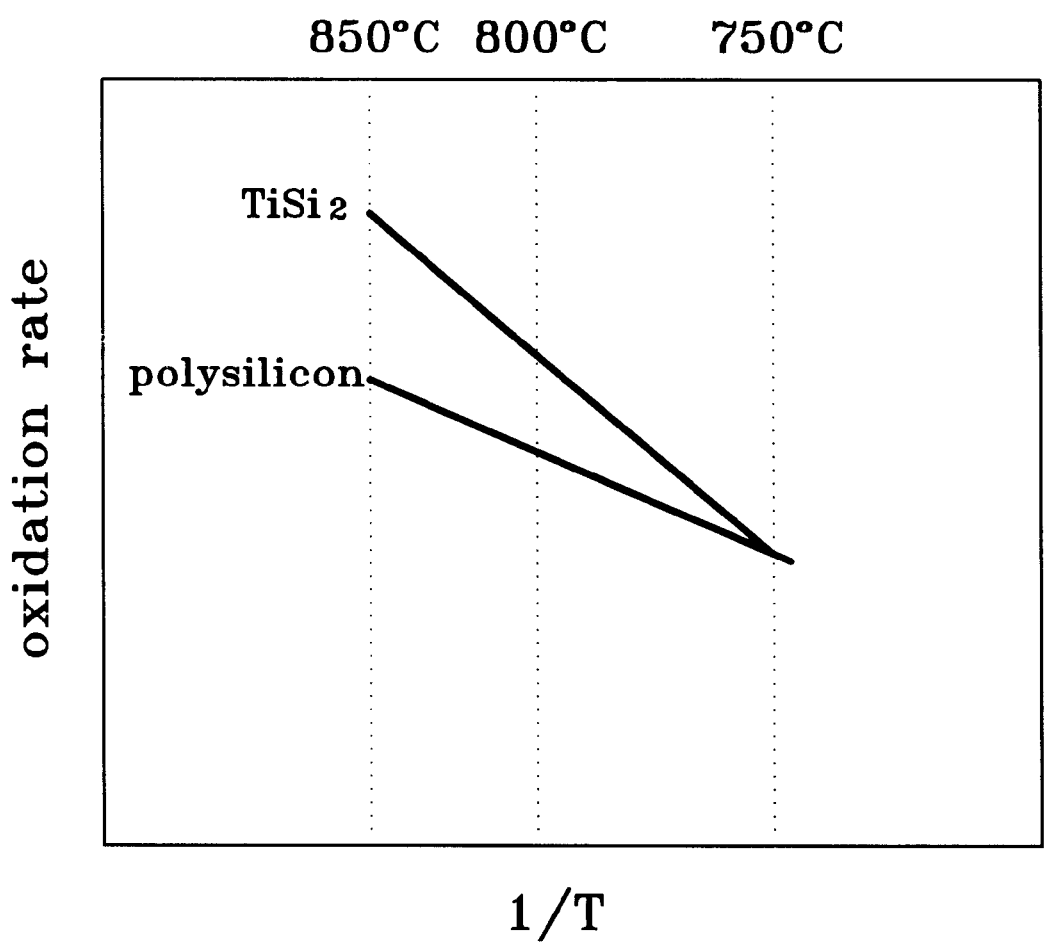
FIG. 3 is a graph showing oxidation rate of a polysilicon layer and a TiSi$_2$ layer to inverse of temperature 1/T.

FIG. 3 is a graph showing oxidation rate of the polysilicon layer 22 and the $TiSi_2$ layer 24a to inverse of temperature 1/T in accordance with the experiment. As shown in FIG. 3, the oxidation rate of the $TiSi_2$ layer 24a increases with increasing temperature and the oxidation rates of the $TiSi_2$ layer 24a and the polysilicon layer 23 are equalized to each other at the temperature of 750° C. or less. However, since the oxidation rates of the $TiSi_2$ layer 24a and the polysilicon layer 23 are very slow at the temperature of 700° C. or less, process time becomes long. Accordingly, it is preferable to perform the re-oxidation process at the temperature of 700 to 750° C.

Furthermore, for example, according to another experiment performing the re-oxidation process using wet oxidation at the temperature of 700° C., 750° C. and 800° C. respectively, at the temperature of 700° C. and 750° C., the oxide layer 26 is uniformly formed on the side wall of the $TiSi_2$ layer 24a and the polysilicon layer 23, as shown in FIG. 2E. On the other hand, at the temperature of 800° C., the oxidation rate of the $TiSi_2$ layer 24a is promoted, so that the side wall of the $TiSi_2$ layer 24a is excessively oxidized as the prior art(Refer to FIG. 1E). However, since the wet oxidation has fast oxidation rate and poor oxidation uniformity as compared to dry oxidation, it is preferable to perform the re-oxidation using dry oxidation.

As the experiments above described, it is most preferable to performing re-oxidation process at the temperature of 700 to 750° C. using dry oxidation. As a result, the oxide layer 26 is formed with uniform thickness. Furthermore, the oxide layer 26 is formed to the thickness of 30 to 60 Å, more preferably 50 Å.

According to the present invention, the re-oxidation process is performed in the range of the temperature in which the oxidation rate of the $TiSi_2$ layer is equalized to that of the polysilicon layer using dry oxidation, thereby preventing excessive oxidation of the $TiSi_2$ layer. As a result, the abnormal oxidation of the gate electrode is prevented, so that it is easy to perform ion-implantation for forming a source and a drain, subsequently. Furthermore, the resistivity of the gate electrode, thereby improving the reliability of device.

Although the preferred embodiment of this invention has been disclosed for illustrative purpose, those skilled in the art will appreciate that various modifications, additions and substitutions are possible, without departing from the scope and spirit of the invention as described in the accompanying claims.

What is claimed is:

1. A method of forming a gate electrode with a titanium polycide structure, comprising the steps of:

forming a gate insulating layer, a polysilicon layer and a titanium silicide layer on a semiconductor substrate, in sequence;

forming a mask insulating layer in the shape of a gate electrode on the titanium silicide layer;

etching the titanium silicide layer and the polysilicon layer using the mask insulating layer as an etch mask to form a gate electrode; and oxidizing the substrate using re-oxidation process to form an oxide layer with an uniform thickness on the side wall of the gate electrode and on the surface of the substrate, wherein the re-oxidation process is performed at the temperature of 750° C. or less using dry oxidation.

2. The method according to claim 1, wherein the re-oxidation process is performed at the temperature of 700 to 750° C.

3. The method according to claim 1, wherein the oxide layer is formed to the thickness of 30 to 60 Å.

4. The method according to claim 3, wherein the oxide layer is formed to the thickness of about 50 Å.

5. The method according to claim 1, wherein the step of forming the titanium silicide layer comprises:

depositing a titanium silicide layer of an amorphous phase on the polysilicon layer; and thermal-treating the titanium silicide layer of the amorphous phase to be transformed into a titanium silicicle layer of a crystalline phase.

6. The method according to claim 5, wherein the titanium silicide layer of the amorphous phase is deposited by physical vapor deposition.

7. The method according to claim 5, wherein the step of thermal-treating is performed by rapid thermal processing.

* * * * *